United States Patent
Goto

(10) Patent No.: US 6,489,765 B2
(45) Date of Patent: Dec. 3, 2002

(54) MAGNETIC FIELD VARIATION MEASURING METHOD AND MAGNETIC FIELD VARIATION COMPENSATING METHOD FOR MRI APPARATUS, AND MRI APPARATUS

(75) Inventor: Takao Goto, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 09/961,174

(22) Filed: Sep. 22, 2001

(65) Prior Publication Data

US 2002/0097049 A1 Jul. 25, 2002

(30) Foreign Application Priority Data

Nov. 15, 2000 (JP) ........................................ 2000-347429

(51) Int. Cl.[7] .................................................. G01V 3/00
(52) U.S. Cl. ...................................... 324/307; 324/309
(58) Field of Search ............................... 324/307, 309, 324/300, 312; 128/653.2, 653.3

(56) References Cited

U.S. PATENT DOCUMENTS 4,685,468 A * 8/1987 Macovaski ................... 128/653
4,970,457 A * 11/1990 Kaufmann ................... 324/309
5,905,377 A * 5/1999 Kerr et al. ................... 324/309

* cited by examiner

Primary Examiner—Edward Lefkowitz
Assistant Examiner—Brij B. Shrivastav
(74) Attorney, Agent, or Firm—Moonray Kojima

(57) ABSTRACT

For the purpose of compensating for a variation in the static magnetic field of an MRI apparatus, RF probes 1P1 and 1P2 are placed and a reference static magnetic field is measured as a reference frequency in the beginning; the static magnetic field is measured at an appropriate time as a frequency to determine the amount of static magnetic field variation from their difference; and the transmission frequency of an RF pulse and the receiving detection frequency of an NMR signal are corrected or the gradient current for a gradient coil is corrected so as to compensate for the amount of the magnetic field variation.

19 Claims, 3 Drawing Sheets

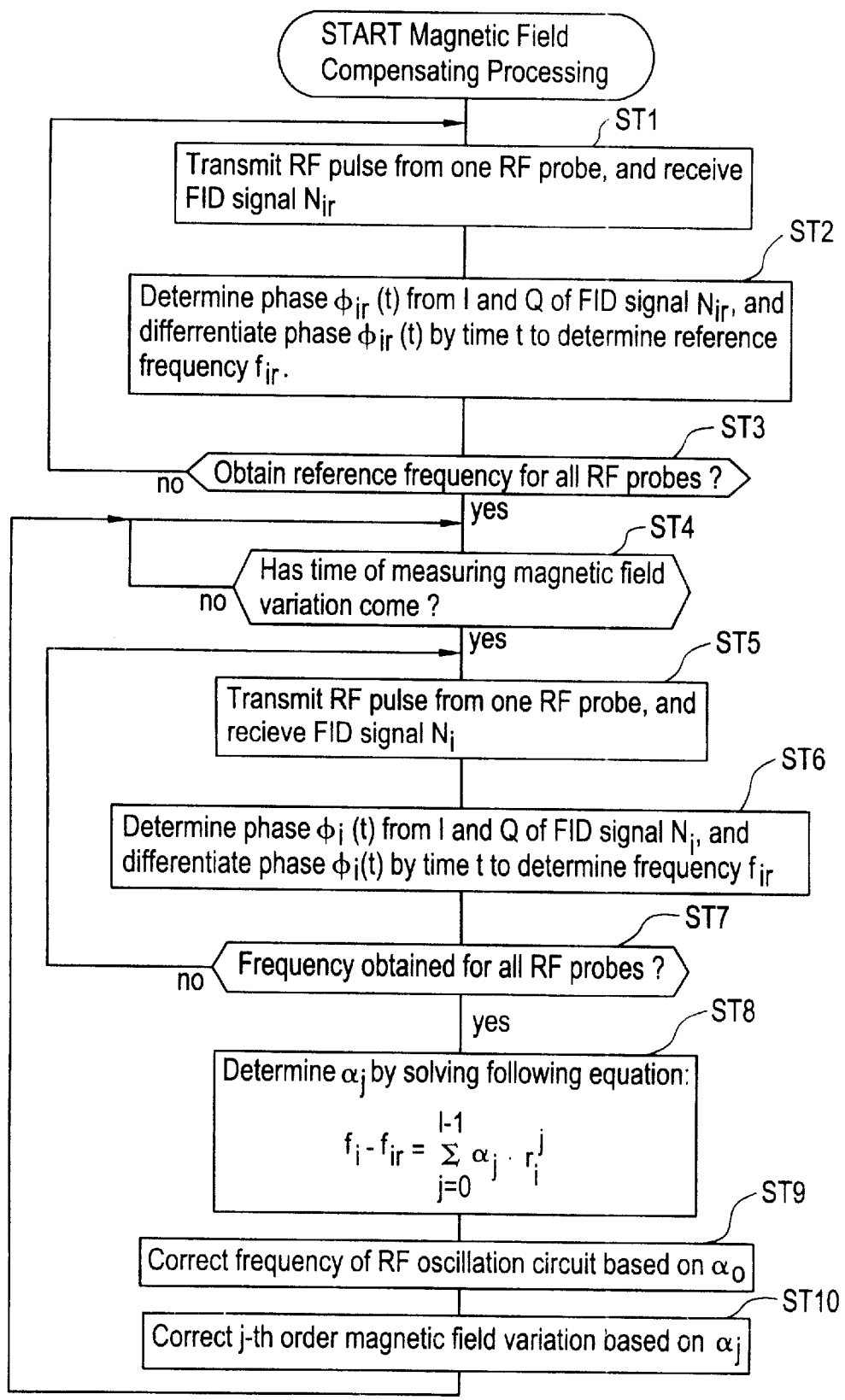

MAGNETIC FIELD VARIATION MEASURING METHOD AND MAGNETIC FIELD VARIATION COMPENSATING METHOD FOR MRI APPARATUS, AND MRI APPARATUS

BACKGROUND OF THE INVENTION

The present invention relates to a magnetic field variation measuring method and magnetic field variation compensating method for an MRI (magnetic resonance imaging) apparatus, and an MRI apparatus, and more particularly to a magnetic field variation measuring method for measuring a variation in a static magnetic field of an MRI apparatus, a magnetic field variation compensating method for compensating a variation in a static magnetic field of an MRI apparatus, and an MRI apparatus capable of implementing such methods.

The static magnetic field of an MRI apparatus should be constant, but when a metal mass (e.g., an automobile) moves near the MRI apparatus or the environment changes (e.g., the temperature changes), the static magnetic field may be undesirably varied.

In the past, measures for dealing with such variation in the static magnetic field have focused on restraining the cause of the variation, such as by magnetically shielding the MRI apparatus or air-conditioning the room where the MRI apparatus is installed.

However, a variation in the static magnetic field sometimes occurs even after the measures have been taken, and in this case, a problem arises in that the image quality is undesirably degraded.

SUMMARY OF THE INVENTION

It is therefore a first object of the present invention to provide a magnetic field variation measuring method that can measure a variation in the static magnetic field of an MRI apparatus.

Moreover, it is a second object of the present invention to provide a magnetic field variation compensating method that can compensate for a variation in a static magnetic field of an MRI apparatus.

Furthermore, it is a third object of the present invention to provide an MRI apparatus that can suitably implement the magnetic field variation measuring method and magnetic field variation compensating method.

In accordance with its first aspect, the present invention provides a magnetic field variation measuring method characterized in: placing I (wherein I≧1) RF probes, each of which has a combination of a small phantom capable of emitting an FID (free induction decay) signal and a small coil, in proximity of an imaging region of an MRI apparatus; transmitting RF pulses from said RF probes at a time when a reference magnetic field is to be measured, and receiving FID signals to determine reference frequencies $f_{ir}$ (wherein i=1–I) from said FID signals; transmitting RF pulses from said RF probes at times when a magnetic field variation is to be measured, and receiving FID signals to determine frequencies $f_i$ from said FID signals; and determining a j-th order magnetic field variation $\alpha_j$ by solving the following equation:

$$f_i - f_{ir} = \sum_{j=0}^{I-1} \alpha_j \cdot r_i^j,$$

wherein the position of each RF probe is represented by $r_j$.

In the magnetic field variation measuring method of the first aspect, RF probes are placed and a reference static magnetic field is measured as a reference frequency in the beginning, and the static magnetic field is measured at appropriate times as a frequency, to determine the amount of a static magnetic field variation from their difference. If the RF probes are fixed, up to an (I–1)-th order magnetic field variation can, in general, be determined.

In accordance with its second aspect, the present invention provides the magnetic field variation measuring method of the aforementioned configuration, characterized in that I=2, and a zeroth-order magnetic field variation $\alpha_0$ and a first-order magnetic field variation $\alpha_1$ are determined.

In the magnetic field variation measuring method of the second aspect, the RF probes are fixed, and zeroth- and first-order magnetic field variations can be determined.

The zeroth-order magnetic field variation is a magnetic field variation that is independent of position, and the first-order magnetic field variation is a magnetic field variation that is a linear function of position.

In accordance with its third aspect, the present invention provides a magnetic field variation measuring method characterized in: placing two RF probes, each of which has a combination of a small phantom capable of emitting an FID signal and a small coil, across an imaging region of an MRI apparatus; transmitting RF pulses from said RF probes at a time when a reference magnetic field is to be measured, and receiving FID signals to determine reference frequencies $f_{1r}$ and $f_{2r}$ from said FID signals; transmitting RF pulses from said RF probes at times when a magnetic field variation is to be measured, and receiving FID signals to determine frequencies $f_1$ and $f_2$ from said FID signals; and determining a zeroth-order magnetic field variation $\alpha_0$ and a first-order magnetic field variation $\alpha_1$ by solving the following equations:

$$\alpha_0 = \frac{(f_1 - f_{1r}) + (f_2 - f_{2r})}{2}$$

$$\alpha_1 = \frac{(f_1 - f_{1r}) - (f_2 - f_{2r})}{2}.$$

In the magnetic field variation measuring method of the third aspect, the RF probes are fixed, and zeroth- and first-order magnetic field variations can be determined.

In accordance with its fourth aspect, the present invention provides the magnetic field variation measuring method of the aforementioned configuration, characterized in that the time when the reference magnetic field is to be measured is immediately before the beginning of a pulse sequence for imaging a first view, and the times when the magnetic field variation is to be measured are immediately before the beginnings of pulse sequences for imaging second and later views.

In the magnetic field variation measuring method of the fourth aspect, when an imaging pulse sequence is repeated to collect data filling a k-space, a magnetic field variation is measured before the beginning of the imaging pulse sequence each time, and therefore a magnetic field variation when a metal mass moves near the MRI apparatus can be dealt with.

Particular examples of the imaging pulse sequence include pulse sequences that observe a gradient echoes, such as one according to GRASS (gradient recalled acquisition in the steady state) or SPGR (spoiled GRASS).

In accordance with its fifth aspect, the present invention provides the magnetic field variation measuring method of the aforementioned configuration, characterized in that the time when the reference magnetic field is to be measured is at startup of the MRI apparatus, and the times when the magnetic field variation is to be measured are at regular time intervals after the startup of the MRI apparatus.

In the magnetic field variation measuring method of the fifth aspect, since the magnetic field variation is measured at startup of the MRI apparatus and at regular time intervals after the startup, a magnetic field variation when the environment changes can be dealt with.

In accordance with its sixth aspect, the present invention provides the magnetic field variation measuring method of the aforementioned configuration, characterized in that the MRI apparatus is an open-type MRI apparatus that generates a static magnetic field in the vertical direction, and the RF probes are disposed above and below the imaging region.

In the magnetic field variation measuring method of the sixth aspect, a variation in the static magnetic field of an open-type MRI apparatus, in which homogeneity of the magnetic field is achieved by mechanical shimming or by adding a plurality of small pieces of magnet or iron, can be suitably measured.

In accordance with its seventh aspect, the present invention provides a magnetic field variation compensating method characterized in correcting the transmission frequency of an RF pulse and the receiving detection frequency of an NMR signal based on the zeroth-order magnetic field variation $\alpha_0$ measured by the magnetic field variation measuring method of the aforementioned configuration.

In the magnetic field variation compensating method of the seventh aspect, the zeroth-order static magnetic field variation can be compensated for by correction of the transmission frequency of an RF pulse and the receiving detection frequency of an NMR signal.

In accordance with its eighth aspect, the present invention provides a magnetic field variation compensating method characterized in correcting the gradient current based on the first and higher order magnetic field variations $\alpha_j$ measured by the magnetic field variation measuring method of the aforementioned configuration.

In the magnetic field variation compensating method of the eighth aspect, the first and higher order static magnetic field variations can be compensated for by correction of the gradient current.

In accordance with its ninth aspect, the present invention provides an MRI apparatus characterized in comprising: I (where I≧1) RF probes, each of which consists of a combination of a small phantom capable of emitting an FID signal and a small coil, disposed in proximity of an imaging region; reference frequency acquiring means for transmitting RF pulses from said RF probes at a time when a reference magnetic field is to be measured, and receiving FID signals to determine reference frequencies $f_{i r}$ (wherein i=1 to I) from said FID signals; frequency acquiring means for transmitting RF pulses from said RF probes at times when a magnetic field variation is to be measured, and receiving FID signals to determine frequencies $f_i$ from said FID signals; and magnetic field variation calculating means for determining a j-th order magnetic field variation $\alpha_j$ by solving the following equation:

$$f_i - f_{ir} = \sum_{j=0}^{I-1} j \cdot r_i^j,$$

wherein the position of each RF probe is represented by $r_i$.

In the MRI apparatus of the ninth aspect, the magnetic field variation measuring method of the first aspect can be suitably implemented.

In accordance with its tenth aspect, the present invention provides the MRI apparatus of the aforementioned configuration, characterized in that I=2, and a zeroth-order magnetic field variation $\alpha_0$ and a first-order magnetic field variation $\alpha_1$ are determined.

In the MRI apparatus of the tenth aspect, the magnetic field variation measuring method of the second aspect can be suitably implemented.

In accordance with its eleventh aspect, the present invention provides an MRI apparatus characterized in comprising: two RF probes, each of which consists of a combination of a small phantom capable of emitting an FID signal and a small coil, disposed across an imaging region; reference frequency acquiring means for transmitting RF pulses from said RF probes at a time when a reference magnetic field is to be measured, and receiving FID signals to determine reference frequencies $f_{1r}$ and $f_{2r}$ from said FID signals; frequency acquiring means for transmitting RF pulses from said RF probes at times when a magnetic field variation is to be measured, and receiving FID signals to determine frequencies $f_1$ and $f_2$ from said FID signals; and magnetic field variation calculating means for determining a zeroth-order magnetic field variation $\alpha_0$ and a first-order magnetic field variation $\alpha_1$ by solving the following equations:

$$\alpha_0 = \frac{(f_1 - f_{1r}) + (f_2 - f_{2r})}{2}$$

$$\alpha_1 = \frac{(f_1 - f_{1r}) - (f_2 - f_{2r})}{2}.$$

In the MRI apparatus of the eleventh aspect, the magnetic field variation measuring method of the third aspect can be suitably implemented.

In accordance with its twelfth aspect, the present invention provides the MRI apparatus of the aforementioned configuration, characterized in that the time when the reference magnetic field is to be measured is immediately before the beginning of a pulse sequence for imaging a first view, and the times when the magnetic field variation is to be measured are immediately before the beginnings of pulse sequences for imaging second and later views.

In the MRI apparatus of the twelfth aspect, the magnetic field variation measuring method of the fourth aspect can be suitably implemented.

In accordance with its thirteenth aspect, the present invention provides the MRI apparatus of the aforementioned configuration, characterized in that the time when the reference magnetic field is to be measured is at startup of the MRI apparatus, and the times when the magnetic field variation is to be measured are at regular time intervals after the startup of the MRI apparatus.

In the MRI apparatus of the thirteenth aspect, the magnetic field variation measuring method of the fifth aspect can be suitably implemented.

In accordance with its fourteenth aspect, the present invention provides the MRI apparatus of the aforementioned configuration, characterized in that the MRI apparatus is an open-type MRI apparatus that generates a static magnetic field in the vertical direction, and the RF probes are disposed above and below the imaging region.

In the MRI apparatus of the fourteenth aspect, the magnetic field variation measuring method of the sixth aspect can be suitably implemented.

In accordance with its fifteenth aspect, the present invention provides the MRI apparatus of the aforementioned configuration, characterized in comprising RF frequency correcting means for correcting the transmission frequency of an RF pulse and the receiving detection frequency of an NMR signal based on the measured zeroth-order magnetic field variation $\alpha_0$.

In the MRI apparatus of the fifteenth aspect, the magnetic field variation compensating method of the seventh aspect can be suitably implemented.

In accordance with its sixteenth aspect, the present invention provides the MRI apparatus of the aforementioned configuration, characterized in comprising gradient current correcting means for correcting the gradient current based on the measured first and higher order magnetic field variations $\alpha_j$.

In the MRI apparatus of the sixteenth aspect, the magnetic field variation compensating method of the eighth aspect can be suitably implemented.

According to the magnetic field variation measuring method for an MRI apparatus of the present invention, the amount of a variation in a static magnetic field caused by a metal mass (e.g., an automobile) moving near the MRI apparatus or an environment change (e.g., a change in temperature) etc. can be measured.

Moreover, according to the magnetic field variation compensating method for an MRI apparatus of the present invention, a variation in the static magnetic field of an MRI apparatus can be compensated for.

Furthermore, according to the MRI apparatus of the present invention, the magnetic field variation measuring method and magnetic field variation compensating method can be suitably implemented.

Further objects and advantages of the present invention will be apparent from the following description of the preferred embodiments of the invention as illustrated in the accompanying drawings.

BRIEF DESCRIPTION OF THE DRAWINGS

FIG. 5 is a flow chart showing the operation of magnetic field variation compensating processing in accordance with the present invention.

DETAILED DESCRIPTION OF THE INVENTION

The present invention will now be described in more detail with reference to embodiments of the present invention shown in the accompanying drawings. It should be noted that the present invention is not limited to these embodiments.

Figure 1:
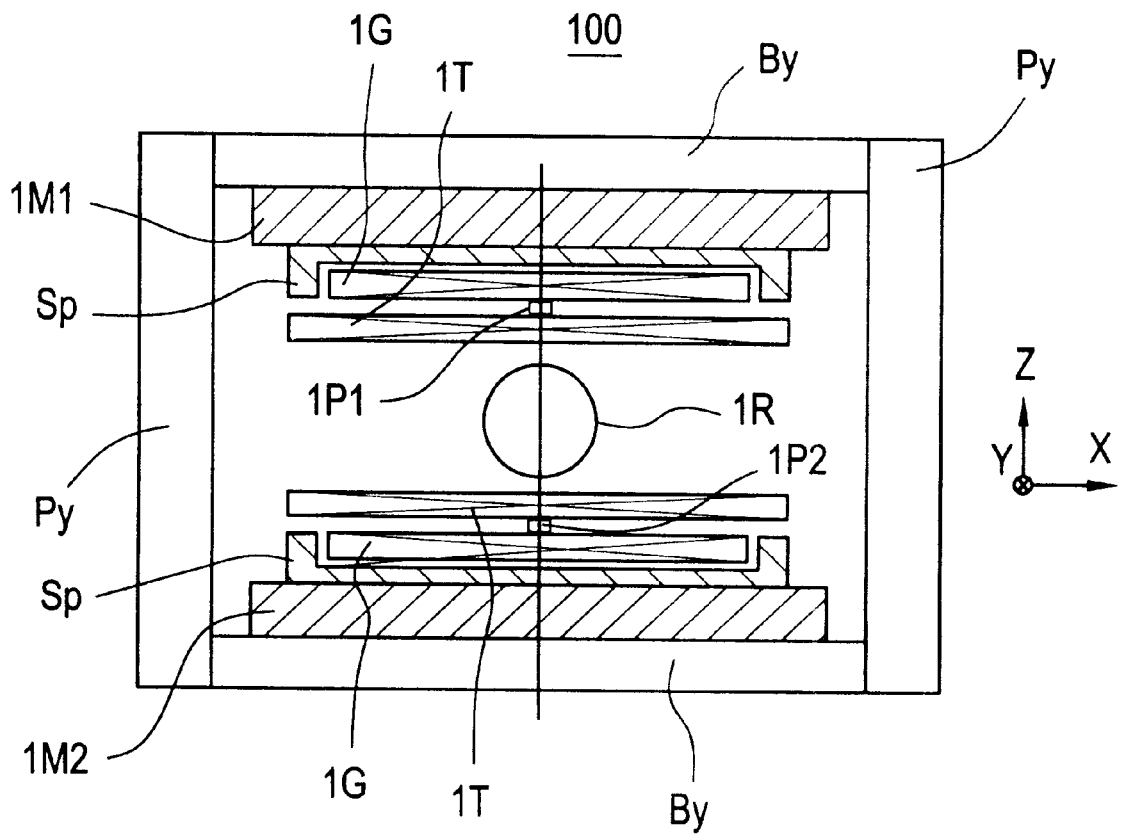
FIG. 1 is a cross-sectional view illustrating a main portion of an MRI apparatus in accordance with one embodiment of the present invention.

FIG. 1 is a cross-sectional view illustrating a major portion of an MRI apparatus 100 in accordance with one embodiment of the present invention.

The MRI apparatus 100 is an open-type MRI apparatus that generates a static magnetic field in the vertical direction by permanent magnets 1M1 and 1M2 disposed above and below and facing each other.

On the surfaces of the permanent magnets 1M1 and 1M2 are disposed respective magnetism conditioning plates Sp for creating an imaging region with a homogeneous static magnetic field inside a receiving coil 1R capable of containing therein a subject.

The permanent magnets 1M1 and 1M2, magnetism conditioning plates Sp and base yokes By and pole yokes Py constitute a magnetic circuit.

On the surfaces of the magnetism conditioning plates Sp are disposed respective gradient coils 1G for generating gradient magnetic fields.

Inside the gradient coils 1G, transmitting coils 1T are disposed for transmitting an RF pulse for exciting spins of atomic nuclei within the subject.

The receiving coil 1R is a coil for receiving an NMR signal emanating from the subject.

Moreover, a first RF probe 1P1 is fixed above and a second RF probe 1P2 is fixed below, interposed between the gradient coils 1G and transmitting coils 1T.

It should be noted that superconductive magnets may be employed instead of the permanent magnets 1M1 and 1M2.

Figure 2:
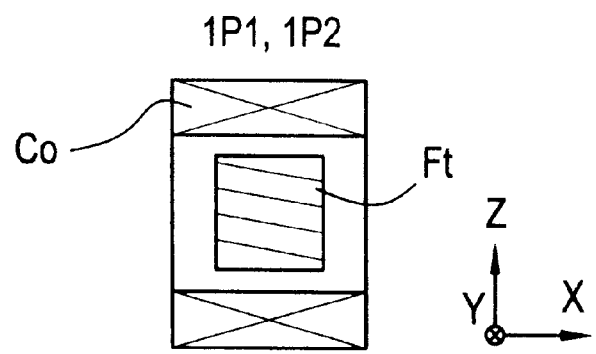
FIG. 2 is a cross-sectional view illustrating one example of an RF probe in accordance with the present invention.

FIG. 2 is an explanatory cross-sectional view illustrating the RF probes 1P1 and 1P2.

The RF probes 1P1 and 1P2 each have a configuration in which a small phantom Ft enclosing NaCl solution or $CuSo_4$ solution capable of emitting an FID signal, and a small coil Co surrounding the small phantom Ft are combined.

Figure 3:
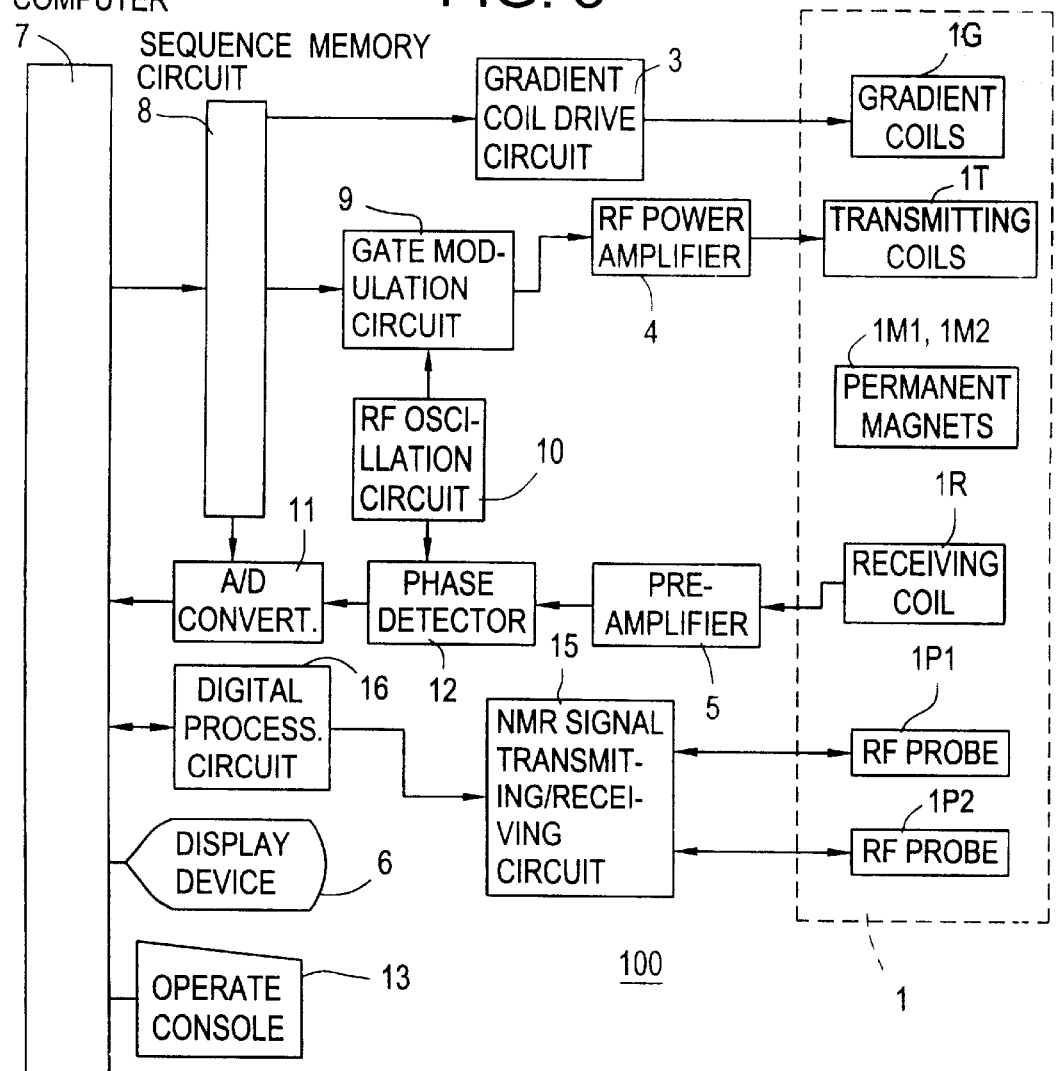
FIG. 3 is a configuration block diagram showing an MRI apparatus in accordance with one embodiment of the present invention.

FIG. 3 is a configuration block diagram showing the MRI apparatus 100.

In the MRI apparatus 100, a magnet assembly 1 is configured to comprise the permanent magnets 1M1 and 1M2, receiving coil 1R, gradient coils 1G, transmitting coils 1T, and RF probes 1P1 and 1P2.

The receiving coil 1R is connected to a preamplifier 5.

The gradient coils 1G are connected to a gradient coil driving circuit 3.

The transmitting coils 1T are connected to an RF power amplifier 4.

The RF probes 1P1 and 1P2 are connected to an NMR signal transmitting/receiving circuit 15.

A sequence memory circuit 8 operates the gradient coil driving circuit 3 based on an imaging pulse sequence, such as one according to a spin echo technique, in response to instructions from a computer 7 to thereby generate an X-axis gradient magnetic field, Y-axis gradient magnetic field and Z-axis gradient magnetic field by the gradient coils 1G. (The gradient coils 1G each consists of an X-axis gradient coil, Y-axis gradient coil and Z-axis gradient coil.) The sequence memory circuit 8 also operates a gate modulation circuit 9 to modulate a high-frequency output signal from an RF oscillation circuit 10 into a pulsed signal of predefined timing and envelope shape. The pulsed signal is applied to the RF power amplifier 4 as an RF pulse signal, power-amplified in the RF power amplifier 4, and then applied to the transmitting coils 1T in the magnet assembly 1 to transmit the RF pulse from the transmitting coils 1T.

The preamplifier 5 amplifies an NMR signal from the subject detected at the receiving coil 1R, and inputs the signal to a phase detector 12. The phase detector 12 phase-detects the NMR signal from the preamplifier 5 employing the output from the RF oscillation circuit 10 as a receiving detection signal, and supplies the phase-detected signal to an A/D converter 11. The A/D converter 11 converts the phase-detected analog signal into digital signal MR data, and inputs it to the computer 7.

The computer 7 performs an image reconstruction operation on the MR data to produce an MR image. The MR image is displayed on a display device 6. The computer 7 is also responsible for overall control such as receiving information input from an operating console 13.

Moreover, the computer 7 executes magnetic field compensating processing. Specifically, it operates the NMR signal transmitting/receiving circuit 15 via a digital processing circuit 16 to transmit an RF pulse from the small coil Co to the small phantom Ft in the RF probe 1P1, and receive an FID signal from the small phantom Ft at the small coil Co, and then determine the amount of a magnetic field variation based on the FID signal to correct the oscillating frequency of the RF oscillation circuit 10 or correct the gradient current of the gradient coils 1G so as to compensate for the amount of the magnetic field variation. The magnetic field compensating processing will be described in more detail later with reference to FIG. 5.

Figure 4:
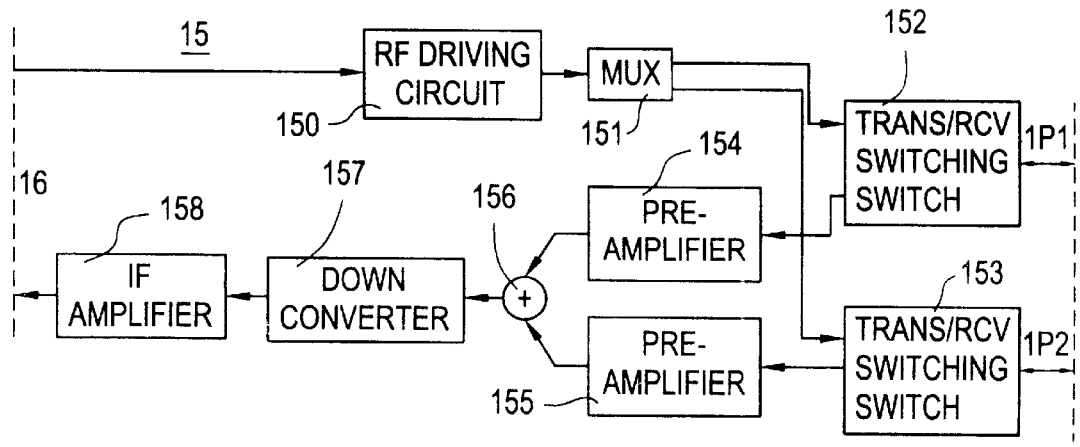
FIG. 4 is a block diagram showing an example of an NMR signal transmitting/receiving circuit in accordance with the present invention.

FIG. 4 is a configuration block diagram of the NMR signal transmitting/receiving circuit 15.

The NMR signal transmitting/receiving circuit 15 comprises an RF driving circuit 150 that comprises an RF oscillation circuit, gate modulation circuit and RF power amplifier; a multiplexer 151 for switching the output destination of RF pulse transmitted signals output from the RF driving circuit 150; transmission/reception switching switches 152 and 153 for switching between transmission of the RF pulse transmitted signals to the RF probes 1P1 and 1P2 and reception of FID received signals from the RF probes 1P1 and 1P2; preamplifiers 154 and 155 for amplifying the FID received signals from the RF probes 1P1 and 1P2; an adder 156 for adding the FID received signals amplified at the preamplifiers 154 and 155; a down converter 157 for converting the frequency of the FID received signals to the intermediate frequency band; and an intermediate frequency amplifier 158 for amplifying the FID signals frequency-converted to the intermediate frequency band.

The digital processing circuit 16 operates the NMR signal transmitting/receiving circuit 15 in response to instructions from the computer 7, and converts the FID signals into digital data and inputs them to the computer 7.

FIG. 5 is a flow chart showing the operation of the magnetic field compensating processing by the MRI apparatus 100. The magnetic field compensating processing is activated immediately before the beginning of a pulse sequence for imaging a first view or at startup of the MRI apparatus 100 (for example, at the startup in the morning).

In Step ST1, an RF pulse is transmitted from one RF probe and an FID signal $N_{ir}$ is obtained. For example, an RF pulse is transmitted from the first RF probe 1P1 and an FID signal $N_{1r}$ is received.

In Step ST2, a phase $\phi_{ir}(t)$ is determined from I and Q of the FID signal $N_{ir}$, and the phase $\phi_{ir}(t)$ is differentiated by the time t to determine a reference frequency $f_{ir}$. For example, a reference frequency $f_{1r}$ is determined from the FID signal $N_{1r}$.

In Step ST3, if the reference frequency has not been obtained for all the RF probes, the process goes back to Step ST1; otherwise goes to Step ST4. For example, if only the reference frequency $f_{1r}$ at the first RF probe 1P1 has been obtained, the process goes back to Step ST1 to obtain a reference frequency $f_{2r}$ at the second RF probe 1P2 in Steps ST1 and ST2, and then the process goes to Step ST4.

In Step ST4, the process waits until the time of measuring the magnetic field variation, and when the time of measuring the magnetic field variation has come, the process goes to Step ST5. The times of measuring the magnetic field variation are immediately before the beginnings of pulse sequences for imaging second and later views, or at regular time intervals after the startup of the MRI apparatus 100 (for example, every hour).

In Step ST5, an RF pulse is transmitted from one RF probe and an FID signal $N_i$ is obtained. For example, an RF pulse is transmitted from the first RF probe 1P1 and an FID signal $N_1$ is received.

In Step ST6, a phase $\phi_i(t)$ is determined from I and Q of the FID signal $N_i$, and the phase $\phi_i(t)$ is differentiated by the time t to determine a frequency $f_i$. For example, a frequency $f_1$ is determined from the FID signal $N_1$.

In Step ST7, if the frequency has not been obtained for all the RF probes, the process goes back to Step ST5; otherwise goes to Step ST8. For example, if only the frequency $f_1$ at the first RF probe 1P1 has been obtained, the process goes back to Step ST5 to obtain a frequency $f_2$ at the second RF probe 1P2 in Steps ST5 and ST6, and then the process goes to Step ST8.

In Step ST8, a j-th order magnetic field variation $\alpha_j$ is determined by solving the following equation:

$$f_i - f_{ir} = \sum_{j=0}^{I-1} \alpha_j \cdot r_i^j,$$

wherein the position of each RF probe is represented by $r_i$.

For example, when the coordinates of the first RF probe 1P1 are represented as (O, O, r) and those of the second RF probe 1P2 are represented as (O, O, −r) in an orthogonal coordinate system (x, y, z) with a coordinate origin (O, O, O) positioned at the center of the imaging region, and I=2, then a zeroth-order magnetic field variation $\alpha_0$ and a first-order magnetic field variation $\alpha_1$ are determined by solving the following simultaneous equations:

$$f_1 - f_{1r} = \alpha_0 + \alpha_1 \cdot r$$

$$f_2 - f_{2r} = \alpha_0 - \alpha_1 \cdot r$$

That is, the zeroth-order magnetic field variation $\alpha_0$ and first-order magnetic field variation $\alpha_1$ are determined by changing the expression of the above equations as follows:

$$\alpha_0 = \frac{(f_1 - f_{1r}) + (f_2 - f_{2r})}{2}$$

$$\alpha_1 = \frac{(f_1 - f_{1r}) - (f_2 - f_{2r})}{2}.$$

In Step ST9, the oscillation frequency of the RF oscillation circuit 10 is corrected based on the zeroth-order magnetic field variation $\alpha_0$.

In Step ST10, the gradient current for the gradient coils 1G is corrected based on the first and higher order magnetic field variations $a_1$, For example, an offset current is applied to the Z-axis gradient coil based on the first-order magnetic field variation $\alpha_1$, . . . A gradient $\Delta G$ to be corrected is:

$$\Delta G = \frac{\alpha_1}{2r \cdot \gamma},$$

wherein the gyromagnetic ratio is represented as $\gamma$.

If three or more RF probes are fixed or an RF probe is moved to obtain the FID signal at three or more positions, the second or higher order magnetic field variation can be compensated for.

Then, the process goes back to Step ST4.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic field variation measuring method, comprising the steps of:
    placing one or more RF probes, each of which has a combination of a small phantom capable of emitting an FID signal and a small coil, in proximity of an imaging region of an MRI apparatus;
    transmitting RF pulses from said one or more RF probes at a time when reference magnetic field is to be measured, and receiving FID signals to determine reference frequencies $F_{ir}$ from said FID signals;
    transmitting RF pulses from said one or more RF probes at times when a magnetic field variation is to be measured, and receiving FID signals to determine frequencies $f_i$ from said FID signals; and
    determining a j-th order magnetic field variation $\alpha_j$ by solving the following equation:

$$f_i - f_{ir} = \sum_{j=0}^{I-1} \alpha_j \cdot r_i^j$$

wherein position of each RF probe is represented by $r_i$ and I represents number of RF probes.

2. The method of claim 1, wherein I=2, wherein frequencies $f_{1r}$ and $f_{2r}$ are determined; and wherein 0-th order magnetic field variation $\alpha_0$ and first order magnetic field variation $\alpha_1$ are determined.

3. The method of claim 2, wherein said 0-th order magnetic field variation $\alpha_0$ and first order magnetic field variation $\alpha_1$ are determined by solving the following equations:

$$\alpha_0 = \frac{(f_1 - f_{1r}) + (f_2 - f_{2r})}{2}$$

$$\alpha_1 = \frac{(f_1 - f_{1r}) - (f_2 - f_{2r})}{2}.$$

4. The method of claim 1, wherein time when said reference field is to be measured is immediately before beginning of a pulse sequence for imaging a first view, and times when said magnetic field variation is to be measured are immediately before beginning of pulse sequence for imaging second and later views.

5. The method of claim 1, wherein time when said reference magnetic field is to be measured is at start up of said MRI apparatus, and times when said magnetic field variation is to be measured are at regular time intervals after startup of said MRI apparatus.

6. The method of claim 1, wherein said MRI apparatus is an open type MRI apparatus that generates a static magnetic field in a vertical direction and said RF probes are disposed above and below said imaging region.

7. A magnetic field variation compensating method, comprising the steps of:
    placing one or more RF probes, each of which has a combination of a small phantom capable of emitting an FID signal and a small coil, in proximity of an imaging region of an MRI apparatus;
    transmitting RF pulses from said one or more RF probes at a time when a reference magnetic field is to be measured, and receiving FID signals to determine reference frequencies $f_{ir}$ said FID signals;
    determining j-th order magnetic field variation $\alpha_j$ by solving the following equation:

$$f_i - f_{ir} = \sum_{j=0}^{I-1} \alpha_j \cdot r_i^j$$

wherein position of each RF probe is represented by $r_i$ and I represents number of RF probes.

8. The method of claim 7, wherein said 0-th order magnetic field variation $\alpha_0$ is obtained by solving the following equation:

$$\alpha_o = \frac{(f_1 - f_{1r}) + (f_2 - f_{2r})}{2}$$

and wherein said 1st order magnetic field variation $\alpha_1$ is obtained by solving the following equation:

$$\alpha_1 = \frac{(f_1 - f_{1r}) - (f_2 - f_{2r})}{2}.$$

9. The method of claim 7, wherein said correcting step corrects said gradient current based on first and higher order magnetic field variations measured by the foregoing steps.

10. An MRI apparatus comprising:
    one or more RF probes disposed in proximity of an imaging region, each of said RF probes comprising a combination of a small phantom capable of emitting an FID signal and a small coil;
    first means for transmitting RF pulses from said one or more RF probes at a time when a reference magnetic field is to be measured, and for receiving FID signals to determine reference frequencies $f_{ir}$ from said FID signals;
    second means for transmitting rF pulses from said one or more RF probes at times when a magnetic field variation is to be measured, and for receiving FID signals to determine frequencies $f_i$ from said FID signals; and
    third means for determining j-th order magnetic field variations $\alpha_j$ by solving the following equation:

$$f_i - f_{ir} = \sum_{j=0}^{I-1} \alpha_j \cdot r_i^j$$

wherein I is number of RF probes, and $r_i$ is position of each RF probe.

11. The apparatus of claim 10, wherein I=2, and wherein said third means determines a zero-th order magnetic field variation $\alpha_0$ and a first-order magnetic field variation $\alpha_1$.

12. The apparatus of claim 10, wherein I is two; wherein said first means determines two reference frequencies $f_{1r}$ and $f_{2r}$ from said FID signals; wherein said second means determines two frequencies $f_1$ and $f_2$ from said FID signals; and wherein said third means comprises means for determining a zero-th order magnetic field variation $\alpha_0$ and a first-order magnetic field variation $\alpha_1$ by solving the following equations:

$$\alpha_o = \frac{(f_1 - f_{1r}) + (f_2 - f_{2r})}{2}$$

$$\alpha_1 = \frac{(f_1 - f_{1r}) - (f_2 - f_{2r})}{2}.$$

13. The apparatus of claim 12, further comprising a fourth means for correcting transmission frequency of an RF pulse and for receiving detection frequency of an NMR signal based on a measured zero-th order magnetic field variation $\alpha_0$.

14. The apparatus of claim 12, further comprising a fourth means for correcting gradient current based on a measured first and higher order magnetic field variation $\alpha_j$.

15. The apparatus of claim 10, wherein time when said reference magnetic field is to be measured is immediately before beginning of a pulse sequence for imaging a first view, and times when said magnetic field variation is to be measured are immediately before beginnings of pulse sequence for imaging second and later views.

16. The apparatus of claim 10, wherein time when said reference magnetic field is to be measured is at start up of said MRI apparatus, and times when said magnetic field variation is to be measured are at regular time intervals after start up of said MRI apparatus.

17. The apparatus of claim 10, wherein said MRI apparatus is of an open type MRI apparatus that generates a static magnetic field in a vertical direction, and said RF probes are disposed above and below said imaging region.

18. The apparatus of claim 10, further comprising a fourth means for correcting transmission frequency of an RF pulse and for receiving detection frequency of an NMR signal based on a measured zero-th order magnetic field variation $\alpha_0$.

19. The apparatus of claim 10, further comprising a fourth means for correcting gradient current based on a measured first and higher order magnetic field variation $\alpha_j$.

* * * * *